US 6,718,530 B2

(12) United States Patent
Kim et al.

(10) Patent No.: US 6,718,530 B2
(45) Date of Patent: Apr. 6, 2004

(54) METHOD AND APPARATUS FOR ANALYZING INDUCTIVE EFFECTS IN A CIRCUIT LAYOUT

(75) Inventors: Ghun Kim, Sunnyvale, CA (US); Yet-Ping Pai, Milpitas, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 57 days.

(21) Appl. No.: 10/207,678

(22) Filed: Jul. 29, 2002

(65) Prior Publication Data

US 2004/0019864 A1 Jan. 29, 2004

(51) Int. Cl.[7] .............................................. G06F 17/50
(52) U.S. Cl. ................................................ 716/6; 716/4
(58) Field of Search ................................... 716/4, 6, 12

(56) References Cited

U.S. PATENT DOCUMENTS

| | | | | |
|---|---|---|---|---|
| 5,875,196 A | * | 2/1999 | Chakradhar et al. | 714/724 |
| 5,886,904 A | * | 3/1999 | Dai et al. | 703/14 |
| 6,029,117 A | * | 2/2000 | Devgan | 702/58 |
| 6,074,426 A | * | 6/2000 | Baumgartner et al. | 703/13 |
| 6,292,926 B1 | * | 9/2001 | Fukui et al. | 716/8 |
| 6,295,636 B1 | * | 9/2001 | Dupenloup | 716/18 |
| 6,301,688 B1 | * | 10/2001 | Roy | 716/4 |
| 6,305,001 B1 | * | 10/2001 | Graef | 716/12 |
| 6,378,123 B1 | * | 4/2002 | Dupenloup | 716/18 |
| 6,438,731 B1 | * | 8/2002 | Segal | 716/2 |
| 6,449,755 B1 | * | 9/2002 | Beausang et al. | 716/5 |
| 6,470,486 B1 | * | 10/2002 | Knapp | 716/18 |
| 6,523,149 B1 | * | 2/2003 | Mehrotra et al. | 716/4 |
| 6,542,860 B1 | * | 4/2003 | McBride | 703/14 |
| 6,567,971 B1 | * | 5/2003 | Banzhaf et al. | 716/18 |

* cited by examiner

*Primary Examiner*—Stacy A. Whitmore
(74) *Attorney, Agent, or Firm*—Park, Vaughan & Fleming LLP

(57) ABSTRACT

One embodiment of the present invention provides a system that considers inductive effects while analyzing noise and propagation delay effect in a circuit layout. The system operates by first receiving the circuit layout, wherein the circuit layout specifies a plurality of nets that carry signals between circuit elements. Next, the system converts a given net into a single signal path, which is divided into a number of segments. The system then calculates inductance, capacitance, and resistance values for each segment. Next, the system uses these inductance, capacitance, and resistance values to produce a model for each segment. The system then couples together models for each segment into a model for the given net. The system uses the model for the given net to determine a noise and propagation delay effect through the given net.

24 Claims, 5 Drawing Sheets

DISTRIBUTION NET 402

METHOD AND APPARATUS FOR ANALYZING INDUCTIVE EFFECTS IN A CIRCUIT LAYOUT

BACKGROUND

1. Field of the Invention

The present invention relates to systems for modeling and analyzing the behavior of circuits. More specifically, the present invention relates to a method and an apparatus for analyzing inductive effects in a circuit layout.

2. Related Art

Integrated circuits for modern computer systems are constantly being improved to provide computer users with more computing power and increased computing speed. To achieve these improvements, integrated circuit dies are becoming larger and are more densely packed with circuits. Additionally, the speed of the clock signals applied to these circuits is constantly being increased.

As clock speeds continue to increase, it is becoming increasingly important carefully route signal lines (nets) between circuit elements in order to meet timing requirements. After signal lines have been routed between circuit elements, a circuit analysis tool is typically used to model the behavior of the circuit in order to verify that the circuit meets its timing requirements. While tools presently exist to analyze capacitive coupling between various nets within an integrated circuit, and resistive-capacitive (RC) delay through a net, these tools are largely ineffective for circuits operating at today's high speeds.

One of the reasons for this ineffectiveness is because existing tools do not consider the effects of inductance on the circuit layout. At low clock frequencies, resistance and capacitance are the dominant factors in determining propagation delay through a net on an integrated circuit. However, as clock frequencies increase, inductance—both self-inductance and mutual inductance with neighboring nets—begins to be a significant factor. Failing to account for inductive effects in a high-speed integrated circuit can lead to non-optimal routing, invalid timing margins, and poor performance of the integrated circuit.

Hence, what is needed is a method and an apparatus that considers inductive effects during the process of analyzing noise and propagation delay effect through nets within an integrated circuit.

SUMMARY

One embodiment of the present invention provides a system that considers inductive effects while analyzing noise and propagation delay effect in a circuit layout. The system operates by first receiving the circuit layout, wherein the circuit layout specifies a plurality of nets that carry signals between circuit elements. Next, the system converts a given net into a single signal path, which is divided into a number of segments. The system then calculates inductance, capacitance, and resistance values for each segment. Next, the system uses these inductance, capacitance, and resistance values to produce a model for each segment. The system then couples together models for each segment into a model for the given net. The system uses the model for the given net to calculate noise value and to determine a propagation delay effect through the given net.

In a variation on this embodiment, calculating the inductance for a segment involves calculating a self-inductance for the segment and calculating a mutual inductance between the segment and a neighboring segment.

In a further variation, the neighboring segment is a segment from a virtual aggressor net.

In yet a further variation, the virtual aggressor net is a composite of neighboring nets of the target net, which should be analyzed in the circuit layout.

In a variation on this embodiment, inductive effects include inductive noise and/or inductive delay.

In a variation on this embodiment, the number of segments is five.

In a variation on this embodiment, the system combines capacitively coupled noise with inductively coupled noise in determining noise and propagation delay effect through the given net.

In a further variation, combining the capacitively coupled noise with the inductively coupled noise involves adding a fraction of the capacitively coupled noise to a fraction of the inductively coupled noise.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

The data structures and code described in this detailed description are typically stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet.

Data Flow

Figure 1:
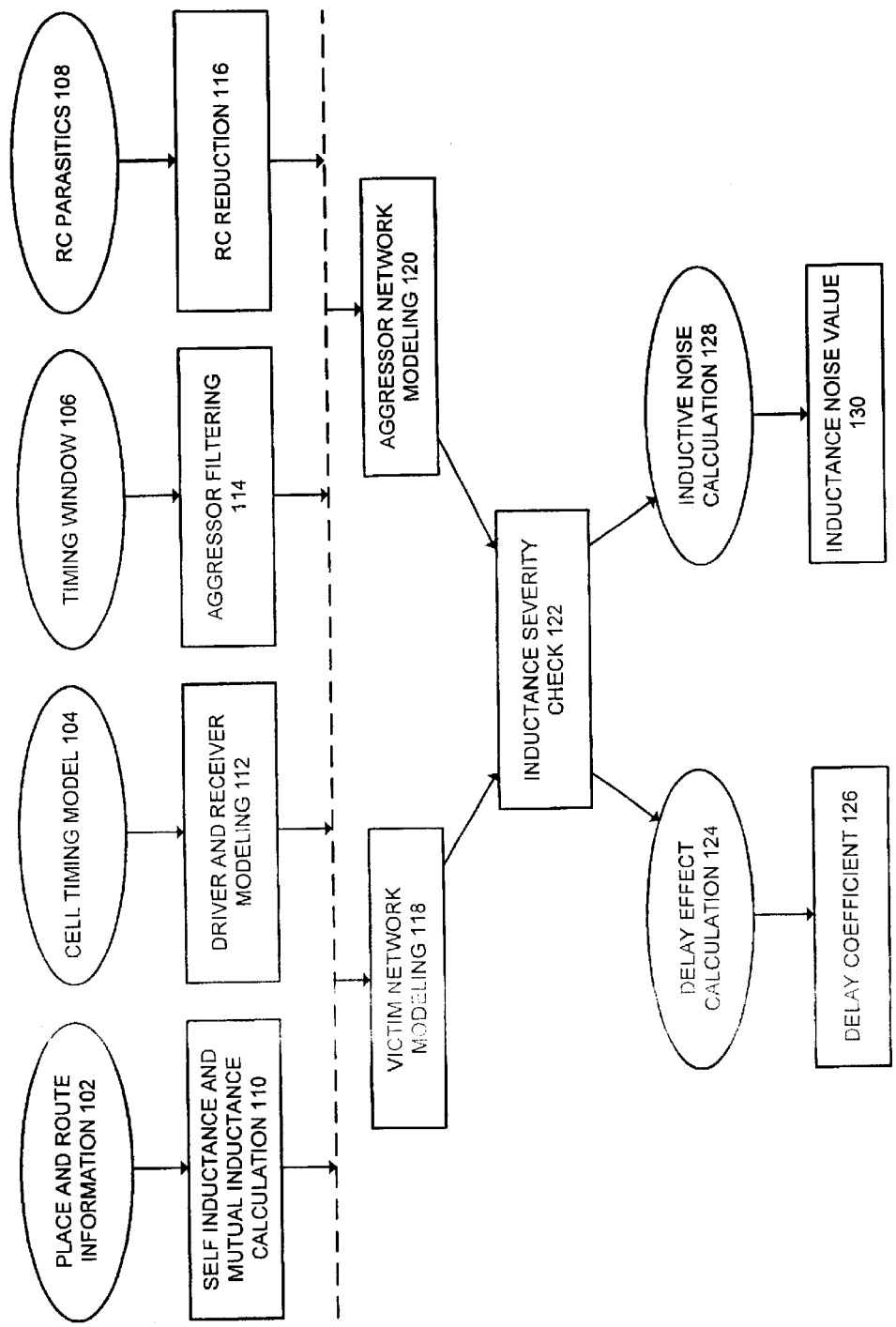
FIG. 1 illustrates data flow within a system for modeling behavior of a circuit layout in accordance with an embodiment of the present invention.

FIG. 1 illustrates data flow within a system for modeling behavior of a circuit layout in accordance with an embodiment of the present invention. Inputs to the system include place and route information 102, cell timing model 104, timing window 106, and RC parasitics 108. Place and route information 102 specifies placement information for circuit elements as well as routing information for signal lines between circuit elements in an integrated circuit layout. Cell timing model 104 includes timing models for the various cell that make up the integrated circuit layout. Timing window 106 includes information related to minimum and maximum timing for various signals. Finally, RC parasitics 108 specifies the resistive and capacitive (RC) characteristics of the nets within the integrated circuit layout.

Self-inductance and mutual inductance calculation module 110 receives place and route information 102 and calculates the self-inductance and mutual inductance for the nets contained in place and route information 102. Driver and receiver modeling module 112 receives cell timing model 104 and non-linear circuit model for net drivers and receivers. Aggressor filtering module 114 receives timing window 106 and carry over aggressor filtering based on timing windows associated with the nets within the integrated circuit. RC reduction module 116 receives RC parasitics 108 and creates the reduced distributed resistance-capacitance (RC) models for the nets within the integrated circuit.

The outputs of self-inductance and mutual inductance calculation module 110, driver and receiver modeling module 112, aggressor filtering module 114, and RC reduction module 116 are used by victim network modeling module 118 and aggressor network modeling module 120. Victim network modeling module 118 models a victim network. A victim network is a network that receives interference from another network on the integrated circuit layout. This interference can be noise and/or delay induced in the victim network by the other network. Aggressor network modeling module 120 models a virtual aggressor network within the integrated circuit layout. The virtual aggressor network can be a composite of the networks other than the victim network that induce noise and delay in the victim network.

Inductance severity check 122 checks the severity of the inductance effects, both within the victim network and the aggressor network and between the victim network and the aggressor network. The output of inductance severity check 122 is supplied to delay effect calculation module 124 and inductive noise calculation module 128. Note that a modeling tool such as SPICE can perform delay effect calculations and inductive noise calculations. Delay effect calculation module 124 produces delay coefficient 126, while inductive noise calculation module 128 produces inductance noise value 130.

Network Models

Figure 2:
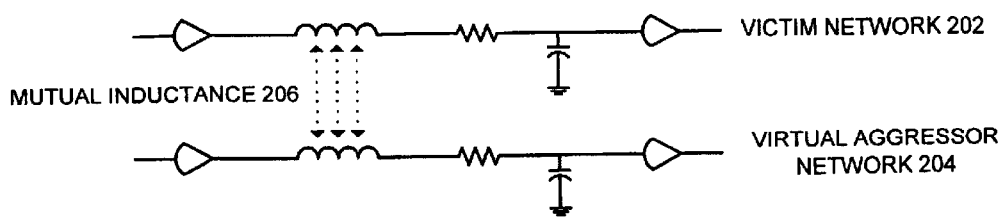
FIG. 2 illustrates a victim network and a virtual aggressor network in accordance with an embodiment of the present invention.

FIG. 2 illustrates a victim network and a virtual aggressor network in accordance with an embodiment of the present invention. Victim network 202 and virtual aggressor network 204 are modeled with lumped values of inductance, resistance, and capacitance. Virtual aggressor network 204 affects victim network 202 through mutual inductance 206 (as well as mutual capacitance). Note that virtual aggressor network 204 can be a composite of the aggressor networks within the integrated circuit layout that affect victim network 202.

Victim and Aggressor Networks

Figure 3A:
FIG. 3A illustrates a victim network in accordance with an embodiment of the present invention.

FIG. 3A illustrates a victim network in accordance with an embodiment of the present invention. In FIG. 3A, the driver and receiver are shown with the lumped resistance and capacitance except the inductance. Note that input signal 304 is applied to victim network 302 so that the delay of input signal 304 through the net can be measured without the effects of aggressor network 306.

Figure 3B:
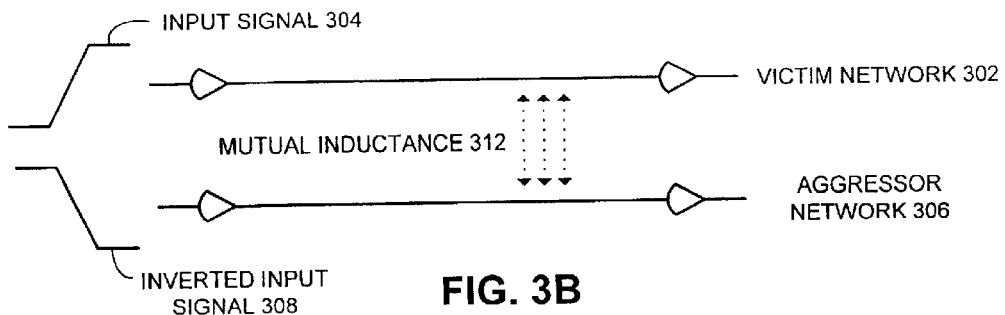
FIG. 3B illustrates victim and aggressor networks receiving out-of-phase signals in accordance with an embodiment of the present invention.

FIG. 3B illustrates victim and aggressor networks receiving out-of-phase signals in accordance with an embodiment of the present invention. In FIG. 3B, victim network 302 receives input signal 304, while aggressor network 306 receives inverted input signal 308. Measurement of the delay of input signal 304 through victim network 302, including the influence of inverted input signal 308 through mutual inductance 312, can be compared with the delay of input signal 304 without the effects of aggressor network 306 to determine the inductive delay effects from an out-of-phase signal on aggressor network 306.

Figure 3C:
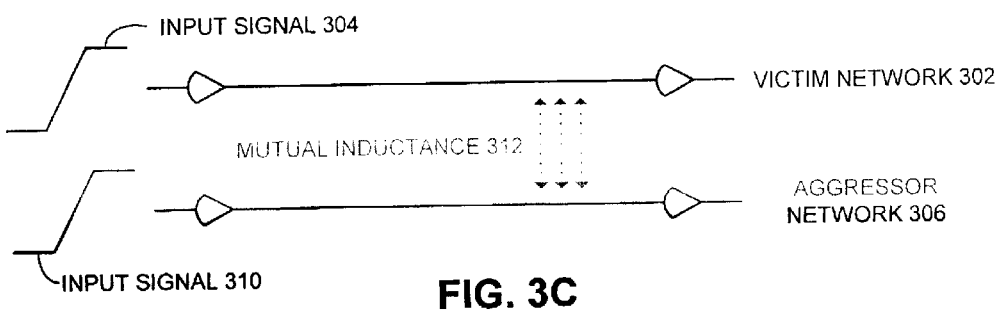
FIG. 3C illustrates victim and aggressor networks receiving in-phase signals in accordance with an embodiment of the present invention.

FIG. 3C illustrates victim and aggressor networks receiving in-phase signals in accordance with an embodiment of the present invention. In FIG. 3C, victim network 302 receives input signal 304, while aggressor network 306 receives input signal 310. Measurement of the delay of input signal 304 through victim network 302, including the influence of input signal 310 through mutual inductance 312, can be compared with the delay of input signal 304 without the effects of aggressor network 306 to determine the inductive delay effects of input signal 310.

A Typical Network

Figure 4A:
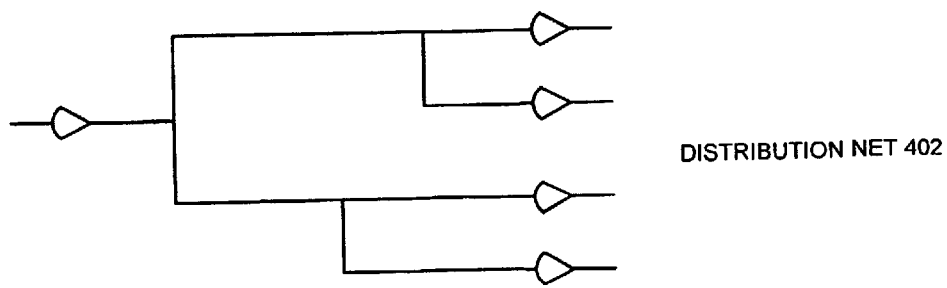
FIG. 4A illustrates a distribution network in accordance with an embodiment of the present invention.

FIG. 4A illustrates a distribution network in accordance with an embodiment of the present invention. The distribution net 402 is a typical net within the integrated circuit layout. Note that distribution net 402 includes multiple branches and multiple receivers.

Figure 4B:
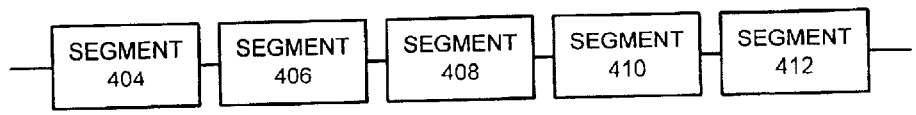
FIG. 4B illustrates the distribution network modeled as a single signal path, which is divided into a number of segments in accordance with an embodiment of the present invention.

FIG. 4B illustrates the clock distribution network modeled as a single signal path, which is divided into a number of segments in accordance with an embodiment of the present invention. More specifically, distribution net 402 has been divided into segments 404, 406, 408, 410, and 412. Note that more or fewer segments can be used. However, empirical evidence suggests that less than five segments yields non-representative values for inductive noise and delay, while more than five segments necessitates additional calculations with little increase in accuracy of inductive noise and delay values.

Figure 4C:
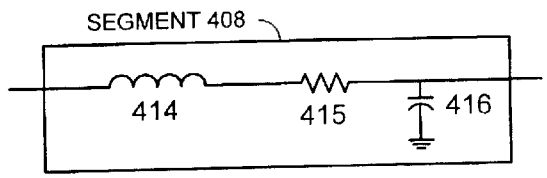
FIG. 4C illustrates a model for a given segment in accordance with an embodiment of the present invention.

FIG. 4C illustrates a model for a given segment in accordance with an embodiment of the present invention. Segment 408 is representative of the individual segments and includes lumped values of inductance 414, resistance 415, and capacitance 416. Note that each segment is paired with a matching segment of the virtual aggressor network through mutual inductance.

Noise Coupling

Figure 5:
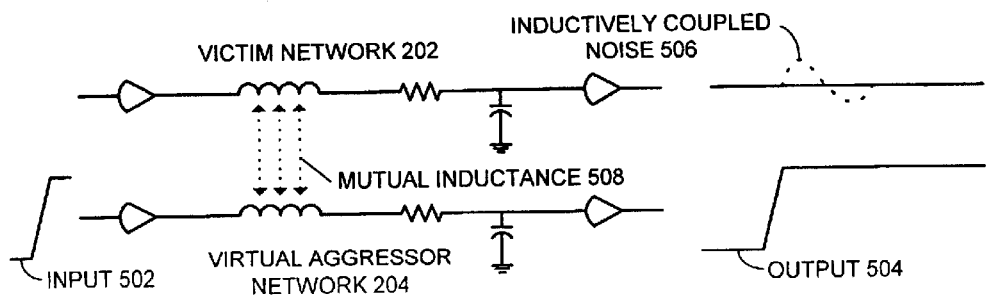
FIG. 5 illustrates inductive coupling in accordance with an embodiment of the present invention.

FIG. 5 illustrates inductive coupling in accordance with an embodiment of the present invention. In FIG. 5, input 502 is applied to virtual aggressor network 204 while the input of victim network 202 is held constant. After a delay, output 504 is received from virtual aggressor network 204. Some portion of the signal within virtual aggressor network 204 is coupled to victim network 202 across mutual inductance 508. This coupled signal results in inductively coupled noise 506. Note that inductively coupled noise 506 can be displaced in time from output 504 and may be of opposite phase from inductively coupled noise 506.

Capacitive and Inductive Noise Coupling

Figure 6:
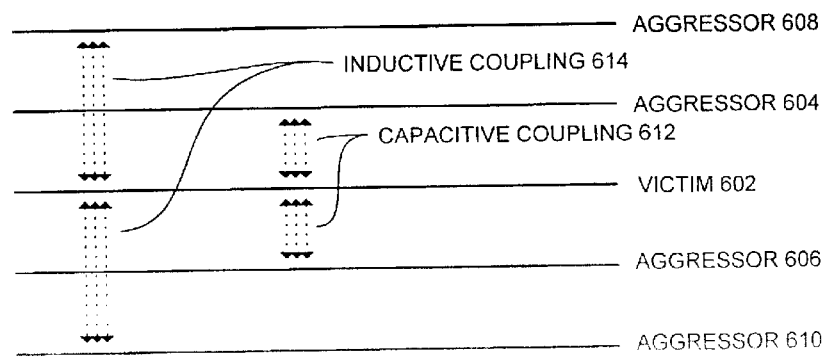
FIG. 6 illustrates inductive and capacitive coupling between victim nets and aggressor nets in accordance with an embodiment of the present invention.

FIG. 6 illustrates inductive and capacitive coupling between victim nets and aggressor nets in accordance with an embodiment of the present invention. In FIG. 6, aggressors 604, 606, 608, and 610 are attacking victim 602. Noise is coupled to victim 602 through capacitive coupling 612 and inductive coupling 614 dominantly. Note that the noise coupled through capacitive coupling 612 is typically cancelled out little bit by inductive coupling from aggressors 604 and 606 as same as the noise coupled through inductive coupling 614 is canceled out little bit by capacitive coupling from aggressors 608 and 610. The total noise, therefore, is not the simple sum of the capacitively coupled noise and the inductively coupled noise. A better estimate of total noise in victim 602 is the sum of a fraction (say 60%) of the capacitively coupled noise added to a fraction (say 60%) of the inductively coupled noise.

Analyzing Inductive Effects

Figure 7:
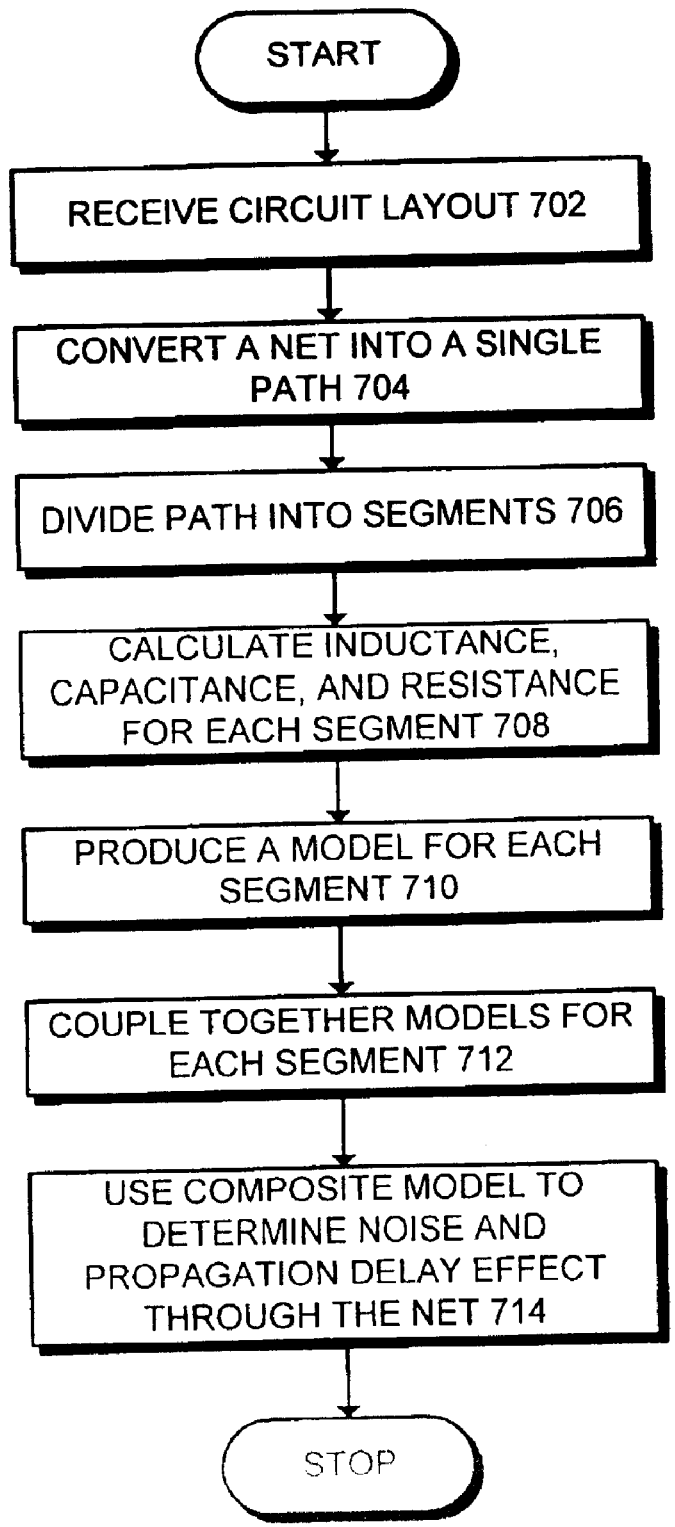
FIG. 7 is a flowchart illustrating the process of considering inductive effects while analyzing noise and propagation delay effect through a net in accordance with an embodiment of the present invention.

FIG. 7 is a flowchart illustrating the process of considering inductive effects while analyzing noise and propagation delay effect through a net in accordance with an embodiment of the present invention. The system starts by receiving a circuit layout for an integrated circuit (step 702). Next, the system converts a net from the circuit layout into a single path (step 704). The system then divides the path into segments (step 706).

After dividing the path into segments, the system calculates the inductance, capacitance, and resistance for each segment (step 708). The system then produces a model for each segment using the calculated values of inductance, capacitance, and resistance (step 710). Next, the system couples together the models for each segment (step 712). The system uses the coupled models to determine the noise and propagation delay effect through the net (step 714).

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for analyzing inductive effects in a circuit layout, comprising:
    receiving routing information for the circuit layout;
    converting a net from the circuit layout into a single path;
    dividing the single path into segments;
    calculating inductance, capacitance, and resistance for each segment;
    producing a model for each segment;
    coupling together models for each segment to form a composite model; and
    determining a noise and a propagation delay effect through the net using the composite model.

2. The method of claim 1, wherein calculating inductance further comprises:
    calculating a self-inductance for a segment; and
    calculating a mutual inductance between the segment and a neighboring segment.

3. The method of claim 2, wherein the neighboring segment is from a virtual aggressor net.

4. The method of claim 3, wherein the virtual aggressor net is a composite of remaining neighbor nets of a victim net in the circuit layout.

5. The method of claim 1, wherein inductive effects include inductive noise and/or inductive delay effect.

6. The method of claim 1, wherein a number of segments is five.

7. The method of claim 1, further comprising combining a capacitively coupled noise with an inductively coupled noise in determining noise and propagation delay effect for a segment.

8. The method of claim 7, wherein combining the capacitively coupled noise with the inductively coupled noise involves adding a fraction of the capacitively coupled noise to a fraction of the inductively coupled noise.

9. A computer-readable storage medium storing instructions that when executed by a computer cause the computer to perform a method for analyzing inductive effects in a circuit layout, the method comprising:
    receiving routing information for the circuit layout;
    converting a net from the circuit layout into a single path;
    dividing the single path into segments;
    calculating inductance, capacitance, and resistance for each segment;
    producing a model for each segment;
    coupling together models for each segment to form a composite model; and
    determining a noise and a propagation delay effect through the net using the composite model.

10. The computer-readable storage medium of claim 9, wherein calculating inductance further comprises:
    calculating a self-inductance for a segment; and
    calculating a mutual inductance between the segment and a neighboring segment.

11. The computer-readable storage medium of claim 10, wherein the neighboring segment is from a virtual aggressor net.

12. The computer-readable storage medium of claim 11, wherein the virtual aggressor net is a composite of remaining nets in the circuit layout.

13. The computer-readable storage medium of claim 9, wherein inductive effects include inductive noise and/or inductive delay effect.

14. The computer-readable storage medium of claim 9, wherein a number of segments is five.

15. The computer-readable storage medium of claim 9, the method further comprising combining a capacitively coupled noise with an inductively coupled noise in determining noise and propagation delay effect for a segment.

16. The computer-readable storage medium of claim 15, wherein combining the capacitively coupled noise with the inductively coupled noise involves adding a fraction of the capacitively coupled noise to a fraction of the inductively coupled noise.

17. An apparatus for analyzing inductive effects in a circuit layout, comprising:
    a receiving mechanism that is configured to receive routing information for the circuit layout;
    a converting mechanism that is configured to convert a net from the circuit layout into a single path;
    a dividing mechanism that is configured to divide the single path into segments;

a calculating mechanism that is configured to calculate inductance, capacitance, and resistance for each segment;

a model producing mechanism that is configured to produce a model for each segment;

a coupling mechanism that is configured to couple together models for each segment to form a composite model; and a noise and delay determining mechanism that is configured to determine a noise and propagation delay effect through the net using the composite model.

18. The apparatus of claim 17, wherein the calculating mechanism is further configured to:

calculate a self-inductance for a segment; and calculate a mutual inductance between the segment and a neighboring segment.

19. The apparatus of claim 18, wherein the neighboring segment is from a virtual aggressor net.

20. The apparatus of claim 19, wherein the virtual aggressor net is a composite of remaining neighbor nets of a victim net in the circuit layout.

21. The apparatus of claim 17, wherein inductive effects include inductive noise and/or inductive delay.

22. The apparatus of claim 17, wherein a number of segments is five.

23. The apparatus of claim 17, further comprising a combining mechanism that is configured to combine a capacitively coupled noise with an inductively coupled noise in determining noise and propagation delay effect for a segment.

24. The apparatus of claim 23, wherein the combining mechanism includes an adding mechanism that is configured to add a fraction of the capacitively coupled noise to a fraction of the inductively coupled noise.

* * * * *